United States Patent
Song

(10) Patent No.: US 8,923,084 B1
(45) Date of Patent: Dec. 30, 2014

(54) MEMORY AND MEMORY SYSTEM INCLUDING THE SAME

(71) Applicant: SK Hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/086,506

(22) Filed: Nov. 21, 2013

(30) Foreign Application Priority Data

Jun. 28, 2013 (KR) ........................ 10-2013-0075498

(51) Int. Cl.
G11C 11/4063 (2006.01)
G11C 11/406 (2006.01)

(52) U.S. Cl.
CPC ...... *G11C 11/4063* (2013.01); *G11C 11/40611* (2013.01)
USPC ..................................... 365/222; 365/230.06

(58) Field of Classification Search
CPC ............. G11C 11/4063; G11C 11/406; G11C 11/40607; G11C 11/40611; G11C 11/40615; G11C 11/40618; G11C 11/22
USPC ........................ 365/222, 185.25, 149, 230.06
See application file for complete search history.

(56) References Cited

U.S. PATENT DOCUMENTS

| | | | | |
|---|---|---|---|---|
| 5,251,177 A | * | 10/1993 | Akamatsu et al. | 365/222 |
| 6,327,209 B1 | * | 12/2001 | Schaefer | 365/222 |
| 7,215,589 B2 | * | 5/2007 | Dono et al. | 365/222 |
| 2011/0141836 A1 | | 6/2011 | Luthra et al. | |

FOREIGN PATENT DOCUMENTS

KR 1020130009591 1/2013

* cited by examiner

*Primary Examiner* — Tan T. Nguyen
(74) *Attorney, Agent, or Firm* — IP & T Group LLP

(57) ABSTRACT

A memory includes a plurality of word lines each coupled with at least one memory cell, an address storing unit that may store at least one target address corresponding to at least one of the word lines, and a control unit that may sequentially activate the plurality of word lines in response to a refresh command that is inputted at a set interval, and may activate the word line selected based on the target address whenever the refresh command is inputted a set number of times that is equal to or more than two times.

15 Claims, 10 Drawing Sheets

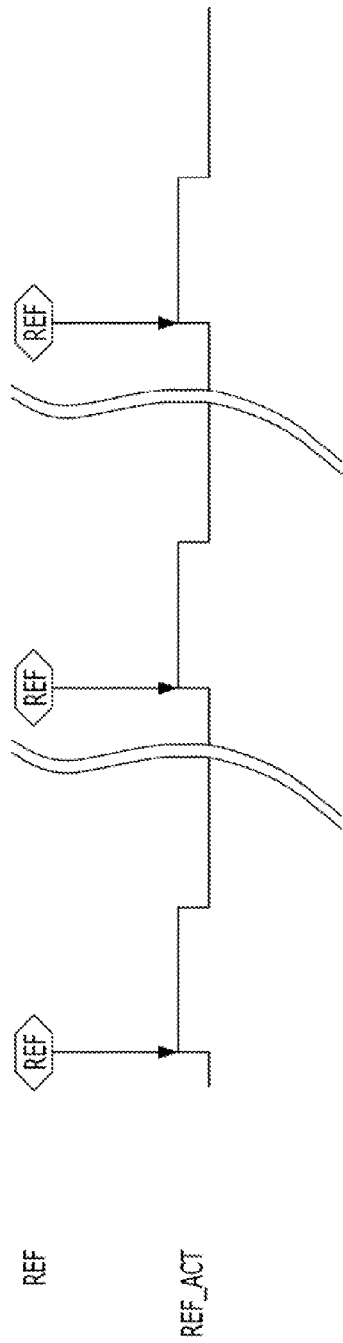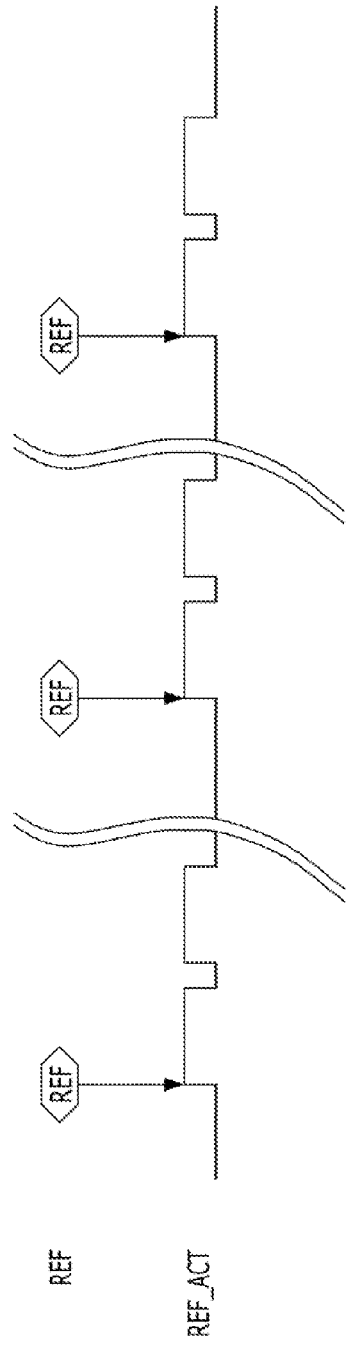

MEMORY AND MEMORY SYSTEM INCLUDING THE SAME

CROSS-REFERENCE TO RELATED APPLICATIONS

The present application claims priority of Korean Patent Application No. 10-2013-0075498, filed on Jun. 28, 2013, which is incorporated herein by reference in its entirety.

BACKGROUND

1. Field

Exemplary embodiments of the present invention relate to a memory and a memory system including the same, and more particularly, to a refresh technology for a memory and a memory system.

2. Description of the Related Art

A memory cell of a memory includes a transistor which functions as a switch and a capacitor for storing charges, that is, a data. The logic level of the data stored in a memory cell may be distinguished between the levels of 'high' (logic 1) and 'low' (logic 0) according to whether there is a charge in the capacitor of the memory cell, that is, whether the voltage at the end of the capacitor is high or low.

A data may be stored and retained in a memory cell so long as charges are accumulated in a capacitor, thereby consuming no power in principle. However, the data may be lost because the initial amount of charges that are stored in the capacitor may decrease due to leakage current caused in a PN bonding/junction of a metal-oxide semiconductor (MOS) transistor. To prevent the loss of data, the data in the memory cell is read before the data gets lost and the memory cell may be recharged to maintain the initial amount of charges according to the information that is read. This operation is to be repeated periodically to retain the data, and the operation of recharging the memory cell is called a refresh operation.

The refresh operation is performed whenever a refresh command is applied from a memory controller to a memory. The memory controller applies the refresh command to the memory every predetermined time in consideration of the data retention time of the memory. For example, when the data retention time of a memory is 64 ms and all of the memory cells in the memory are refreshed only after the refresh command is applied 8000 times, the memory controller applies the refresh command to the memory 8000 times during the term of 64 ms. When it turns out in a memory test process that the data retention time of some memory cells included in the memory do not exceed a predetermined reference time, the memory is regarded as a defective memory and abandoned.

SUMMARY

An embodiment of the present invention is directed to a memory that operates properly even when the memory includes a memory cell having an insufficient data retention time, and a memory system including the memory.

Another embodiment of the present invention is directed to a memory that operates properly even when the memory includes a memory cell whose data has a risk of deterioration due to word line disturbance, and a memory system including the memory.

In accordance with an embodiment of the present invention, a memory includes a plurality of word lines each coupled with at least one memory cell, an address storing unit that may store at least one target address corresponding to at least one of the word lines, and a control unit that may sequentially activate the plurality of word lines in response to a refresh command that is inputted at a set interval, and activate the word line selected based on the target address whenever the refresh command is inputted a set number of times that is equal to or more than two times.

In accordance with another embodiment of the present invention, a memory includes a plurality of word lines each coupled with at least one memory cell, an address input unit that may receive an external input address, an address counting unit that may perform a counting operation and may generate a counting address based on a counting operation result when a refresh command is inputted, an address storing unit that may store at least one target address corresponding to at least one of the word lines, and a control unit that may activate at least a word line corresponding to the external input address when an active command is inputted, may activate at least a word corresponding to the counting address in response to the refresh command, and may activate the word line selected based on the target address whenever the refresh command is inputted a set number of times that is equal to or more than two times.

In accordance with yet another embodiment of the present invention, a memory system includes a memory including a plurality of word lines each coupled with at least one memory cell, and that may sequentially activate the plurality of word lines in response to a refresh command and may activate a word line selected based on a stored target address among the plurality of word lines whenever the refresh command is inputted a set number of times that is equal to or more than two times, and a memory controller that may input the refresh command to the memory at a set interval during a refresh operation.

The word line selected based on the target address may include at least one among, a first word line coupled with a memory cell having a shorter data retention time than a reference time, a second word line activated in response to an active command more than a reference number of times; a third word line adjacent to the second word line; a fourth word line activated in response to the active command in a frequency satisfying a set condition; and a fifth word line adjacent to the fourth word line.

The memory controller may input an active command and an address to the memory during an active operation. And the memory may activate at least a word line corresponding to the address inputted from the memory controller in response to the active command.

The memory may activate a word line corresponding to an external input address when an active command is inputted, and activating a word line corresponding to a counting address, which is generated by performing a counting operation whenever the refresh command is inputted, when the refresh command is inputted, and activating the word line selected based on the target address whenever the refresh command is inputted in the number of times.

The memory may activate at least one word line whenever the refresh command is inputted, and activating at least two word lines which are more than the at least one word line, where the at least two word lines include a word line selected based on the target address, whenever the refresh command is inputted N times, where N is a natural number equal to or greater than 2.

In accordance with still another embodiment of the present invention, a memory includes a plurality of cell arrays each of which includes a plurality of word lines each coupled with at least one memory cell, an address storing unit that may store at least one target address corresponding to at least one of the word lines of the cell arrays, and a refresh control unit that may activate a plurality of first refresh active signals corresponding to the respective cell arrays in response to a refresh command that is inputted at a set interval and activate a plurality of second refresh active signals corresponding to the respective cell arrays whenever the refresh command is inputted a set number of times that is equal to or more than two times, and a plurality of word line control units that may sequentially activate the plurality of word lines of a corresponding cell array in response to a corresponding first refresh active signal among the plurality of first refresh active signals, and may activate the word line selected based on the target address of the corresponding cell array in response to a corresponding second refresh active signal among the plurality of second refresh active signals.

BRIEF DESCRIPTION OF THE DRAWINGS

FIGS. 2A and 2B illustrate a refresh operation of the memory shown in FIG. 1 in a refresh operation mode;

DETAILED DESCRIPTION

Figure 1:
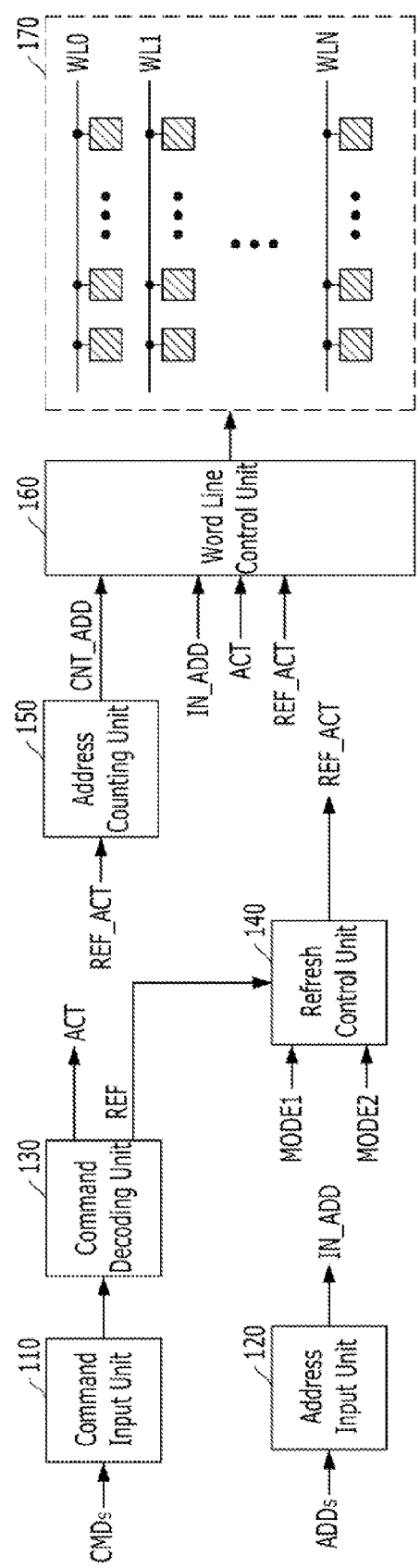
FIG. 1 is a block view of a memory for describing a refresh operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereafter, when a word line is activated in response to a refresh command, the memory cell coupled with the activated word line is refreshed. Therefore, the activation of a word line in response to a refresh command signifies that the memory cell coupled with the word line is refreshed. Also, the refreshment of the word line means that the memory cells coupled with the word line are refreshed.

FIG. 1 is a block view of a memory for describing a refresh operation.

Referring to FIG. 1, the memory includes a command input unit 110, an address input unit 120, a command decoding unit 130, a refresh control unit 140, an address counting unit 150, a word line control unit 160, and a cell array 170 including a plurality of word lines WL0 to WLN. Each word line is coupled with a plurality of memory cells MC.

The command input unit 110 receives a command $CMD_s$ applied from a memory controller. The address input unit 120 receives an address $ADD_s$ applied from the memory controller. Each of the command $CMD_s$ and the address $ADD_s$ includes multi-bit signals.

The command decoding unit 130 decodes the command $CMD_s$ inputted through the command input unit 110 to generate an active command ACT and a refresh command REF. When the input combination $CMD_s$ of command signals corresponds to the active command ACT, the active command ACT is activated. Otherwise, when the input combination $CMD_s$ of command signals represents the refresh command REF, the refresh command REF is activated. Additionally, the command decoding unit 130 decodes the input combination $CMD_s$ of command signals to generate such commands as a pre-charge command, a read command, and a write command, but since these functions are not directly related to the present invention, they are not illustrated and described herein.

The refresh control unit 140 controls a refresh operation of the memory in response to the refresh command REF. When the refresh command REF is inputted, the refresh control unit 140 activates a refresh active signal REF_ACT for controlling the refresh of the cell array 170 one or more times. Herein, the number of times that the refresh active signal REF_ACT is activated when the refresh command REF is inputted once may be different according to how a refresh operation mode is set up. The number of times that the refresh active signal REF_ACT is activated when the refresh command REF is inputted once is related to the number of word lines that are refreshed when the refresh command REF is inputted once.

For example, when the refresh operation mode of the memory is set as a first mode for example, a first mode signal MODE1 is activated, the refresh active signal REF_ACT may be activated once when the refresh command REF is inputted once. When the refresh operation mode of the memory is set as a second mode for example, a second mode signal MODE2 is activated, the refresh active signal REF_ACT may be activated twice when the refresh command REF is inputted once.

The address counting unit 150 performs a counting operation one or more times when the refresh command REF is inputted, and generates a counting address CNT_ADD based on the counting operation result, which is used when a refresh operation is performed in the cell array 170. The address counting unit 150 generates the counting address CNT_ADD by performing the counting operation whenever the refresh active signal REF_ACT is activated. For example, when the refresh active signal REF_ACT is activated, the address counting unit 150 increases the value of the counting address CNT_ADD by 1, which means that when a $K^{th}$ word line WLK is selected and refreshed, the address is varied so that a $(K+1)^{th}$ word line WLK+1 is selected and refreshed next time.

The word line control unit 160 activates a word line selected based on an address IN_ADD or CNT_ADD, then after an intended operation is performed, it pre-charges (deactivates) the activated word line. The word line control unit 160 activates the word line, that is selected based on the address IN_ADD inputted from the address input unit 120, in response to the active command ACT during an active operation, and it activates i.e. refreshes, the word line, that is selected based on the counting address CNT_ADD, in response to the refresh active signal REF_ACT during a refresh operation.

FIGS. 2A and 2B illustrate a refresh operation of the memory shown in FIG. 1 in a refresh operation mode. The refresh operation mode may be used within the memory to increase the frequency of performing a refreshing operation while the frequency that the refresh command is inputted from the memory controller is constant.

FIG. 2A illustrates a refresh operation of the memory when the refresh operation mode of the memory is set in a first operation mode.

Referring to FIG. 2A, whenever the refresh command REF is inputted, the refresh active signal REF_ACT is activated once within the memory, and one word line is refreshed. In the first operation mode, those memory cells having a short data retention time may have their data lost, causing malfunction of the memory.

FIG. 2B illustrates a refresh operation of the memory when the refresh operation mode of the memory is set in a second operation mode.

Referring to FIG. 2B, whenever the refresh command REF is inputted, the refresh active signal REF_ACT is activated twice within the memory, and two word lines are refreshed. In the second operation mode, the memory performs the refresh operation two times more than in the first operation mode during the same time, reducing the data retention time for the memory into a half of the data retention time required in the first operation mode. Therefore, a memory cell even having a short data retention time may be properly refreshed in the second operation mode as compared to the first operation mode.

When the word lines are refreshed more frequently, much more current is consumed. Therefore, more current is consumed when the refresh operation is performed in the second operation mode than when the refresh operation is performed in the first operation mode.

Figure 3:
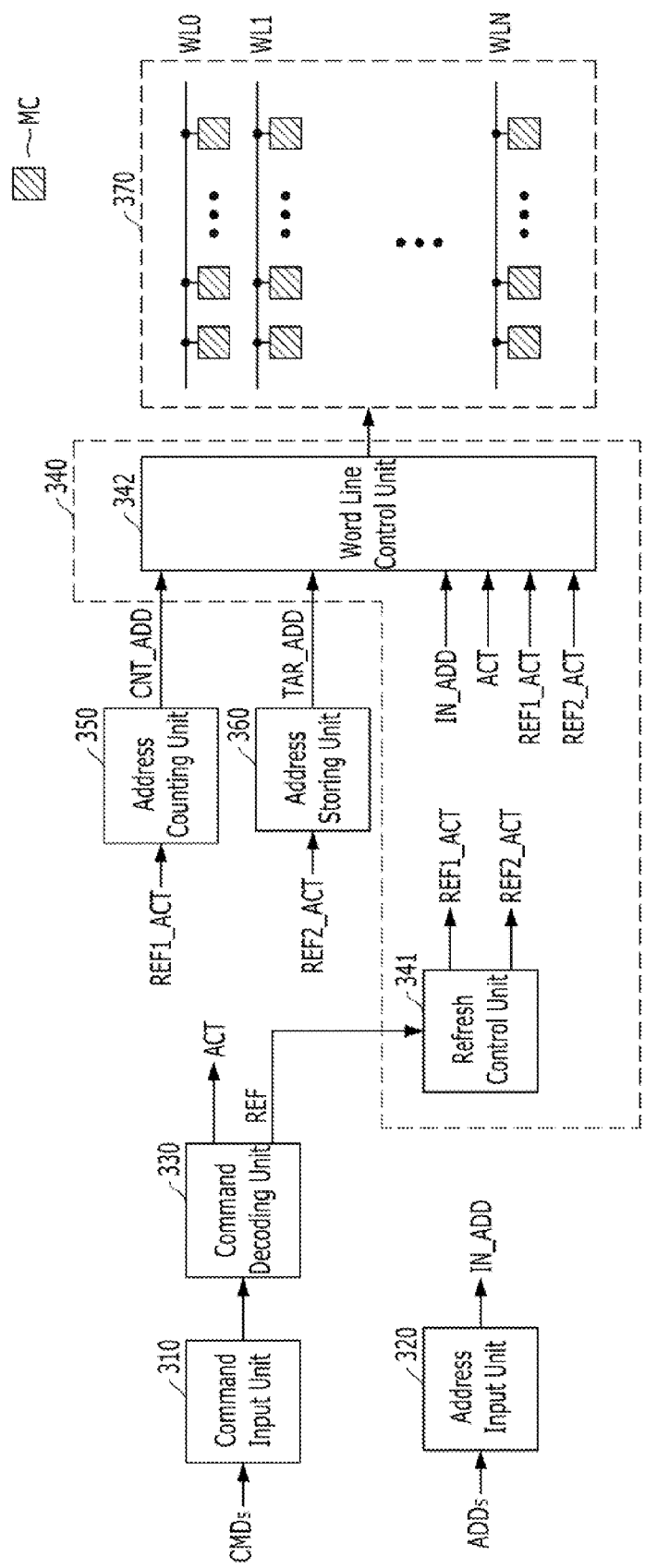
FIG. 3 is a block view illustrating a memory in accordance with an embodiment of the present invention.

FIG. 3 is a block view illustrating a memory in accordance with an embodiment of the present invention.

Referring to FIG. 3, the memory includes a command input unit 310, an address input unit 320, a command decoding unit 330, a control unit 340, an address counting unit 350, an address storing unit 360, and a cell array 370 including a plurality of word lines WL0 to WLN each of which is coupled with a plurality of memory cells MC. FIG. 3 shows structures that are related to an active operation and a refresh operation performed in a memory, and the other structures that are not directly related to the technology of the present invention, such as a read operation and a write operation, are omitted.

Hereafter, the memory is described with reference to FIG. 3.

The command input unit 310 receives a command $CMD_S$ applied from a memory controller. The address input unit 320 receives an address $ADD_S$ applied from the memory controller. Each of the command $CMD_S$ and the address $ADD_S$ includes multi-bit signals.

The command decoding unit 330 decodes the command $CMD_S$ inputted through the command input unit 310 to generate an active command ACT and a refresh command REF. The command decoding unit 330 is the same as described above with reference to FIG. 1.

The control unit 340 activates a word line, which is selected based on addresses IN_ADD, CNT_ADD and TAR_ADD among the plurality of word lines WL0 to WLN of the cell array 370, in response to a command ACT or REF. The control unit 340 activates a word line corresponding to an input address IN_ADD inputted by the address input unit 320 when an active command ACT is inputted during an active operation. The control unit 340 sequentially activates the plurality of word lines WL0 to WLN in response to a refresh command REF that is inputted at a predetermined interval during a refresh operation. The control unit 340 activates the word line selected based on a target address TAR_ADD whenever the refresh command REF is inputted a predetermined number of times, which is N times hereafter, that is equal to or more than twice. The control unit 340 may select at least one word line by using the target address TAR_ADD, among the word line corresponding to the target address TAR_ADD and the word lines adjacent to the word line corresponding to the target address TAR_ADD.

The control unit 340 activates at least one word line whenever the refresh command REF is inputted, and the control unit 340 activates at least two word lines including a word line corresponding to the target address TAR_ADD, which is more than the at least one word line, whenever the refresh command REF is inputted N times, where N is a natural number equal to or greater than 2. In summary, the control unit 340 refreshes more word lines than general cases, whenever the refresh command REF is inputted N times. For the operation, the control unit 340 may include a refresh control unit 341 and a word line control unit 342.

Described hereafter is a case where the control unit 340 activates one word line whenever the refresh command REF is inputted, and it activates two word lines whenever the refresh command REF is inputted 8 times (N=8), where one of the two word lines is a word line corresponding to the target address TAR_ADD.

The refresh control unit 341 controls the refresh operation of the memory in response to the refresh command REF. The refresh control unit 341 activates a first refresh active signal REF1_ACT in response to the refresh command REF, and it activates a second refresh active signal REF2_ACT one or more times whenever the refresh command REF is inputted N times, where N is a natural number equal to or greater than 2.

The refresh control unit 341 activates the first refresh active signal REF1_ACT once whenever the refresh command REF is inputted, and whenever the refresh command REF is inputted 8 times, it activates the first refresh active signal REF1_ACT once and then additionally activates the second refresh active signal REF2_ACT once.

The word line control unit 342 activates a word line corresponding to the input address IN_ADD when the active command ACT is inputted, a word line corresponding to a counting address CNT_ADD when the first refresh active signal REF1_ACT is activated, and a word line selected based on the target address TAR_ADD when the second refresh active signal REF2_ACT is activated. The word line selected based on the target address TAR_ADD may include at least one word line among the word line corresponding to the target address TAR_ADD and the word lines adjacent to the word line corresponding to the target address TAR_ADD.

The address counting unit 350 performs a counting operation one or more times when the refresh command REF is inputted, and generates a counting address CNT_ADD based on the counting operation result. For example, the address counting unit 350 increases the value of the counting address CNT_ADD by '1' whenever the first refresh active signal REF1_ACT is activated, which means that when a $K^{th}$ word line WLK is selected and refreshed, the address is varied so that a $(K+1)^{th}$ word line WLK+1 is selected and refreshed next time. Therefore, the word lines WL0 to WLN are sequentially refreshed by using the counting address CNT_ADD.

The address storing unit 360 stores at least one target address TAR_ADD that corresponds to at least one word line among the plurality of word lines WL0 to WLN. When the second refresh active signal REF2_ACT is activated, the address storing unit 360 outputs the stored target address TAR_ADD. When the number of the target addresses TAR_ADD stored in the address storing unit 360 is two or more, the address storing unit 360 may sequentially output the at least two target addresses TAR_ADD one by one whenever the second refresh active signal REF2_ACT is activated.

The word line selected based on the target address TAR_ADD may be a word line that satisfies at least one of the following conditions: (1) a first condition that the word line is coupled with a memory cell having a shorter data retention time than a reference time; (2) a second condition that the word line is activated in response to the active command ACT more than the reference number of times or adjacent to such a word line; and (3) a third condition that the word line is activated in response to the active command ACT in the frequency of certain conditions or adjacent to such a word line. FIG. 3 illustrates the first condition (1) that the word line corresponding to the target address TAR_ADD is coupled with a memory cell whose data retention time is shorter than the reference time. The conditions (2) and (3) will be described later with reference to FIG. 6.

The word line coupled with a memory cell MC whose data retention time is shorter than the reference time may be detected through a test performed in the course of fabricating the memory. Therefore, the target address TAR_ADD may be detected through the test performed in the course of fabricating the memory and stored in the address storing unit 360. Herein, the reference time may be decided according to the design specification of the memory. For example, if the design specification specifies the reference time to be 64 ms, the word line coupled with a memory cell whose data retention time is shorter than 64 ms is to be refreshed additionally before the term of 64 ms passes.

Figure 4:
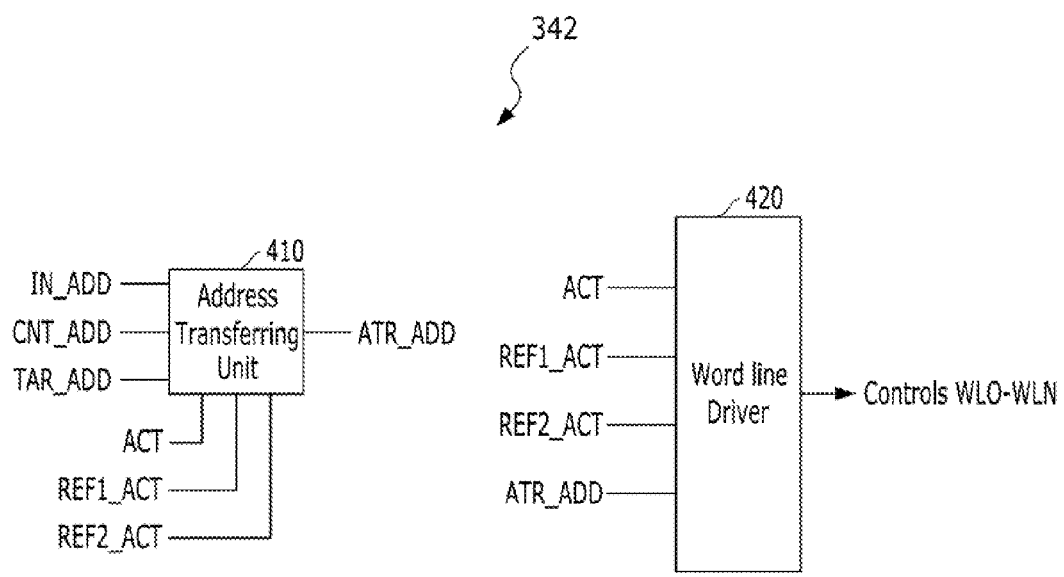
FIG. 4 is a block view illustrating a word line control unit 342 shown in FIG. 3.

FIG. 4 is a block view illustrating the word line control unit 342.

Referring to FIG. 4, the word line control unit 342 may include an address transferring unit 410 and a word line driver 420.

The address transferring unit 410 transfers one among the input address IN_ADD, the counting address CNT_ADD, and the target address TAR_ADD as an address signal ATR_ADD. The address transferring unit 410 transfers the input address IN_ADD as the address signal ATR_ADD when the active command ACT is activated, and when the first refresh active signal REF1_ACT is activated, it transfers the counting address CNT_ADD as the address signal ATR_ADD. When the second refresh active signal REF2_ACT is activated, it transfers the target address TAR_ADD as the address signal ATR_ADD.

The word line driver 420 activates a word line corresponding to the address signal ATR_ADD among the plurality of word lines WL0 to WLN, when one signal among the active command ACT, the first refresh active signal REF1_ACT, and the second refresh active signal REF2_ACT is activated. The word line driver 420 may drive the word line selected based on the address signal ATR_ADD to the activation voltage level.

Figure 5:
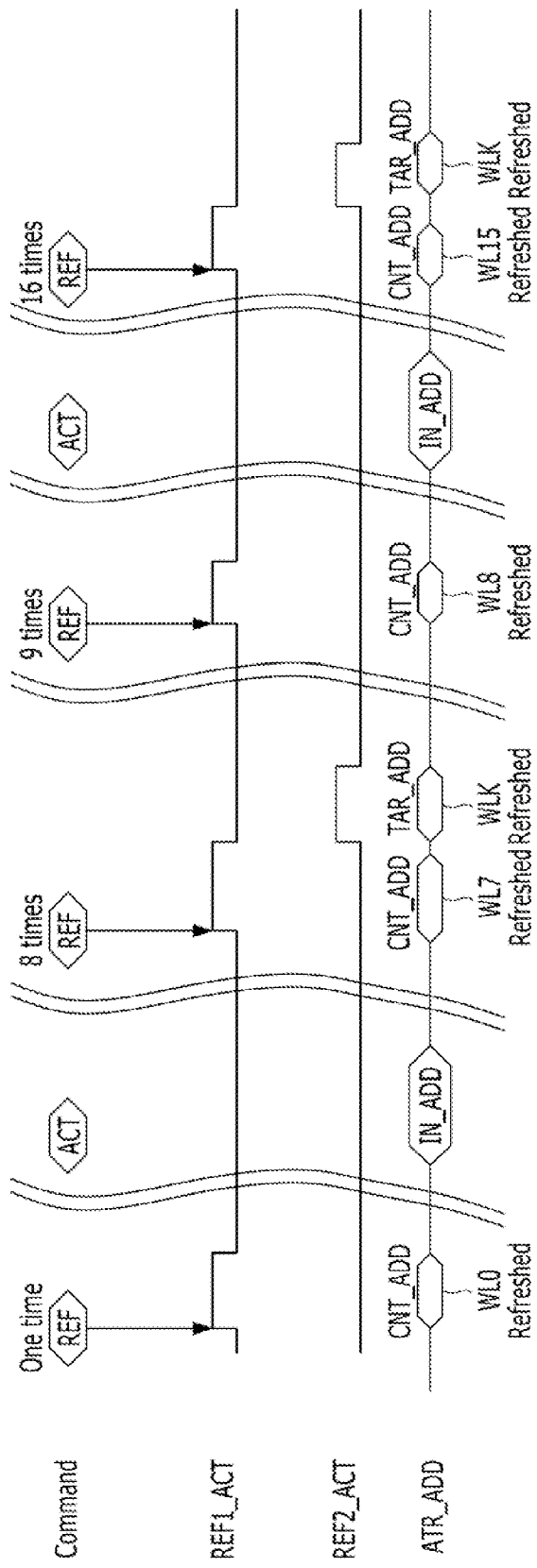
FIG. 5 illustrates an operation of the memory shown in FIG. 3.

FIG. 5 illustrates an operation of the memory shown in FIG. 3.

Described hereafter is a case where one word line is refreshed when the refresh command REF is inputted and two word lines including one word line that is selected based on the target address TAR_ADD are refreshed whenever the refresh command REF is inputted 8 times. The refresh command REF is inputted at a predetermined interval, and the active command ACT may be inputted between the inputs of the refresh command REF. It is described as an example herein that the refresh operation begins from the word line WL0 and the word line WLK corresponds to the target address TAR_ADD.

The operation of the memory is described with reference to FIGS. 3 to 5.

When the refresh command REF is inputted for the first time, the first refresh active signal REF1_ACT is activated and the counting address CNT_ADD is transferred as the address signal ATR_ADD. The counting address CNT_ADD has a value corresponding to the word line WL0 thus the word line WL0 is refreshed among the plurality of word lines WL0 to WLN. When the refresh command REF is inputted for the second to seventh times, the counting address CNT_ADD is transferred as the address signal ATR_ADD just as the refresh command REF is inputted for the first time and the word lines WL1 to WL6 are sequentially refreshed.

When the active command ACT is inputted between the inputs of the refresh command REF, the input address IN_ADD is transferred as the address signal ATR_ADD and the word line corresponding to the input address IN_ADD is activated among the plurality of word lines WL0 to WLN.

When the refresh command REF is inputted for the eighth time, the first refresh active signal REF1_ACT is activated first then the counting address CNT_ADD is transferred as the address signal ATR_ADD to activate the word line WL7. Subsequently, the second refresh active signal REF2_ACT is activated and the target address TAR_ADD is transferred as the address signal ATR_ADD and the word line WLK is refreshed additionally regardless of the general refresh operation that is being performed.

Subsequently, when the refresh command REF is inputted, the counting address CNT_ADD is transferred as the address signal ATR_ADD to refresh a word line, just as the refresh command REF is inputted for the first time, and whenever the refresh command REF is inputted for multiple times of 8, the target address TAR_ADD is additionally transferred as the address signal ATR_ADD to refresh the word line WLK.

According to the embodiment of the present invention, the memory may sequentially refresh the plurality of word lines one by one whenever the refresh command REF is inputted, and when the refresh command REF is inputted a predetermined number of times that is equal to or more than twice, the memory additionally refreshes a word line selected based on the target address TAR_ADD so that the word line coupled with a memory cell MC having a short data retention time could be used as a normal word line, while reducing the current consumption of the memory by minimizing the number of word lines refreshed in each refresh operation.

Described above is a case where the plurality of word lines are refreshed one by one whenever the refresh command REF is inputted and the word line selected based on the target address TAR_ADD is additionally refreshed whenever the refresh command REF is inputted 8 times. In accordance with exemplary embodiments, one or more word lines may be activated whenever the refresh command REF is inputted and more word lines than the one or more word lines may be activated whenever the refresh command REF is applied a predetermined number of times that is not 8 times but equal to or more than twice. Whenever the refresh command REF is applied N times, only the word line selected based on the target address TAR_ADD may be refreshed. Whenever the refresh command REF is inputted N times, the address counting unit 350 may be designed not to perform the counting operation and the refresh control unit 341 may be designed not to activate the first refresh active signal REF1_ACT.

Figure 6:
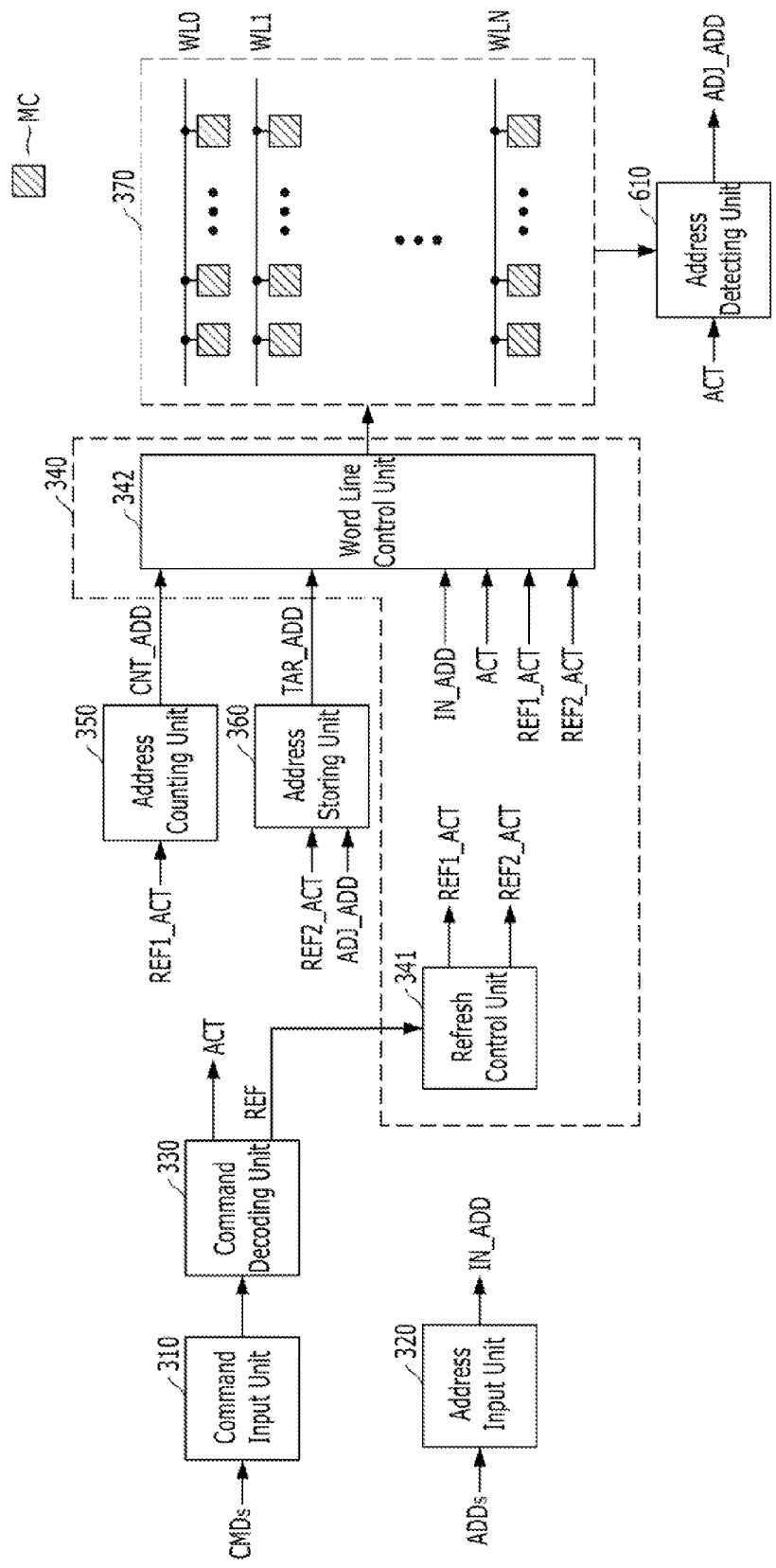
FIG. 6 is a block view illustrating a memory in accordance with another embodiment of the present invention.

FIG. 6 is a block view illustrating a memory in accordance with another embodiment of the present invention.

The memory of FIG. 6 may include an address detecting unit 610 in addition to the structures of the memory shown in FIG. 3. The structures and operations of the memory shown in FIG. 6 are the same as those shown in FIG. 3, except for the address detecting unit 610.

As described above with reference to FIG. 3, the word line selected based on the target address TAR_ADD may be a word line that satisfies at least one of the conditions (1), (2) and (3). The target address TAR_ADD of the word line that satisfies the first condition (1) may be stored in the process of fabricating the memory. The target address TAR_ADD of the word line that satisfies the conditions (2) and (3) may be detected by the address detecting unit 610 in the middle of the operation of the memory and stored in the address storing unit 360.

As the integration degree of a memory is increased, the space between the word lines of the memory is decreased. The decrease in the space between the word lines increases the coupling effect between neighboring word lines. For this reason, when any word line is activated too many times or too frequently during a refresh operation in the memory, the data of a memory cell MC coupled with a word line adjacent to the word line may be damaged.

Therefore, the memory may store the address corresponding to a word line that satisfies condition (2) or condition (3) in the address storing unit 360 as the target address TAR_ADD. To this end, the memory detects a word line activated in response to an active command ACT more than a reference number of times or a word line activated in response to the active command ACT in the frequency of certain conditions. The memory stores the address DET_ADD of the detected word line or the address ADJ_ADD of a word line adjacent to the detected word line in the address storing unit 360.

The address detecting unit 610 counts the number of times that the plurality of word lines WL0 to WLN are activated, and detects a word line activated more than the reference number of times among the plurality of word lines WL0 to WLN based on the counting result. The address detecting unit 610 then stores the address DET_ADD of the detected word line or the address ADJ_ADD of a word line adjacent to the detected word line in the address storing unit 360.

Additionally, the address detecting unit 610 stores a history of the plurality of word lines WL0 to WLN being activated and detects a word line whose frequency of being activated satisfies a predetermined condition among the plurality of word lines WL0 to WLN based on the history. The address detecting unit 610 then stores the address DET_ADD of the detected word line or the address ADJ_ADD of a word line adjacent to the detected word line in the address storing unit 360. Herein, the predetermined condition may be a condition that a particular word line is activated a second number of times or more whenever the active command ACT is inputted a first number of times. The predetermined condition may also be a condition that the above-described condition is satisfied a third number of times or more.

For example, the predetermined condition may be a condition that a particular word line is activated three times or more whenever the active command ACT is inputted 10 times. Also, the predetermined condition may be a condition that the above condition is satisfied 5 times or more. The predetermined condition may be set diversely.

Herein, since the word line adjacent to the word line detected by the address detecting unit 610 is under the influence of word line disturbance, the control unit 340 is to refresh the word line adjacent to the detected word line corresponding to the address DET_ADD during an additional refresh operation.

When the address storing unit 360 stores the detected address DET_ADD, the address storing unit 360 outputs the detected address DET_ADD as the target address TAR_ADD, and the control unit 340 uses the target address TAR_ADD, and selects and activates the word line adjacent to the word line corresponding to the target address TAR_ADD.

Even if the address storing unit 360 stores the detected address DET_ADD, the address storing unit 360 may change the detected address DET_ADD into the address of the word line adjacent to the word line corresponding to the detected address DET_ADD and output it as the target address TAR_ADD. The control unit 340 may select and activate the word line corresponding to the target address TAR_ADD. Herein, the address may be changed by adding or subtracting a predetermined value to or from the detected address DET_ADD. For example, when the neighboring word lines have their addresses different by '1' from each other, the address storing unit 360 may add or subtract a value of '1' to or from the detected address DET_ADD and output the result as the target address TAR_ADD.

When the address storing unit 360 stores the address ADJ_ADD of the word line that is adjacent to the word line corresponding to the detected address DET_ADD, the address storing unit 360 outputs the address ADJ_ADD of the adjacent word line as the target address TAR_ADD, and the control unit 340 uses the target address TAR_ADD to select and activate the word line corresponding to the target address TAR_ADD.

According to the embodiment of the present invention, the memory may sequentially refresh the plurality of word lines one by one whenever the refresh command REF is inputted, and when the refresh command REF is inputted a predetermined number of times that is equal to or more than twice, the memory additionally refreshes a word line selected based on the target address TAR_ADD so that the word line coupled with a memory cell MC having a short data retention time could be used as a normal word line, while reducing the current consumption of the memory by minimizing the number of word lines refreshed for each refresh operation.

Figure 7:
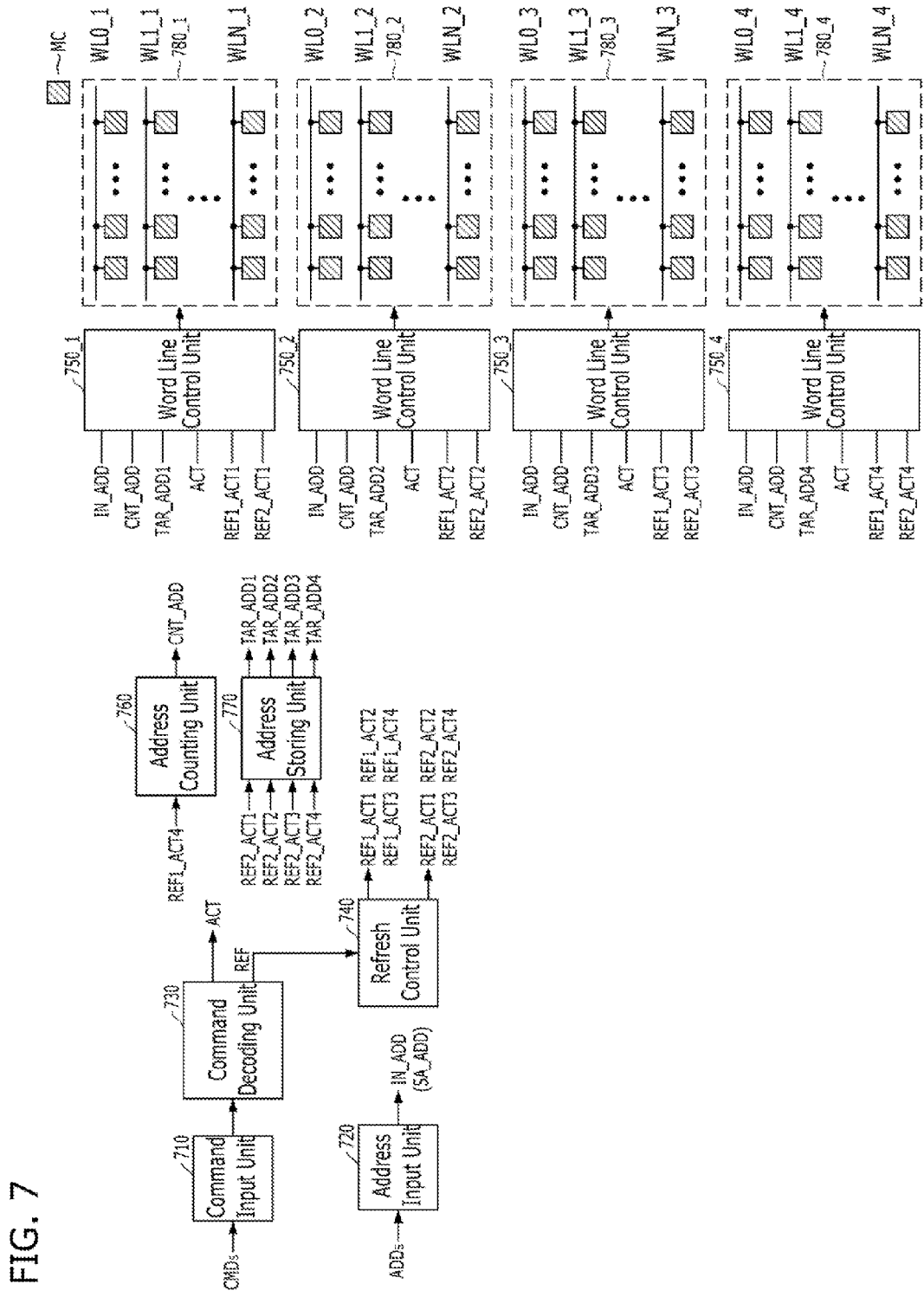
FIG. 7 is a block view illustrating a memory in accordance with yet another embodiment of the present invention.

FIG. 7 is a block view illustrating a memory in accordance with yet another embodiment of the present invention.

Referring to FIG. 7, the memory includes a command input unit 710, an address input unit 720, a command decoding unit 730, a refresh control unit 740, a plurality of word line control units 750_1 to 750_4, an address counting unit 760, an address storing unit 770, and a plurality of cell arrays 780_1 to 780_4 (FIG. 7 shows a case where there are four cell arrays). FIG. 7 illustrates structures related to an active operation and a refresh operation in the memory, and structures related to such operations as a read operation and a write operation that are not directly related to the present invention are omitted. The memory shown in FIG. 7 refreshes all cell arrays when it performs a refresh operation.

The memory is described with reference to FIG. 7.

The command input unit 710, the address input unit 720, and the command decoding unit 730 are the same as the command input unit 310, the address input unit 320, and the command decoding unit 330. An input address IN_ADD received in the address input unit 720 may include a cell array address SA_ADD for selecting one cell array among the plurality of cell arrays 780_1 to 780_4.

The refresh control unit 740 controls a refresh operation of the memory in response to a refresh command REF. The refresh control unit 740 sequentially activates a plurality of first refresh active signals REF1_ACT1 to REF1_ACT4 that respectively correspond to the cell arrays 780_1 to 780_4 in response to the refresh command REF. Also, the refresh control unit 740 activates a plurality of second refresh active signals REF2_ACT1 to REF2_ACT4 that respectively correspond to the cell arrays 780_1 to 780_4 whenever the refresh command REF is inputted N times, where N is a natural number equal to or greater than 2.

The refresh control unit 740 activates the first refresh active signals REF1_ACT1 to REF1_ACT4 once, whenever the refresh command REF is inputted, and whenever the refresh command REF is inputted 8 times, the refresh control unit 740 activates the first refresh active signals REF1_ACT1 to REF1_ACT4 once then additionally activates the second refresh active signals REF2_ACT1 to REF2_ACT4 once. Herein, the first refresh active signals REF1_ACT1 to REF1_ACT4 and the second refresh active signals REF2_ACT1 to REF2_ACT4 are sequentially activated at a predetermined interval in order to reduce peak current caused by the refresh operation. The first refresh active signals REF_ACT1 to REF1_ACT4 and the second refresh active signals REF2_ACT1 to REF2_ACT4 are all activated within the duration of the refresh operation, which is a refresh cycle tRFC.

The plurality of word line control units 750_1 to 750_4 activate a word line corresponding to the input address IN_ADD in response to an active command ACT when a corresponding cell array is selected among the plurality of cell arrays 780_1 to 780_4. When a first refresh active signal REF1_ACT1 is activated among the plurality of first refresh active signals REF1_ACT1 to REF1_ACT4, the respective word line control units 750_1 to 750_4 activate a word line corresponding to a counting address CNT_ADD, and when the plurality of second refresh active signals REF2_ACT1 to REF2_ACT4 are activated, they activate the word lines selected based on target addresses TAR_ADD1 to TAR_ADD4. A method of the word line control units 750_1 to 750_4 selecting word lines based on the target addresses TAR_ADD1 to TAR_ADD4 in the cell arrays 780_1 to 780_4 is the same as described above with reference to FIGS. 3 to 6.

The address counting unit 760 performs a counting operation one or more times when the refresh command REF is inputted, and the address counting unit 760 generates the counting address CNT_ADD based on the counting operation result. The address counting unit 760 increases the value of the counting address CNT_ADD by '1' whenever one among the plurality of first refresh active signals REF1_ACT1 to REF1_ACT4 is activated. FIG. 7 shows a case where the address counting unit 760 performs the counting operation in response to the first refresh active signal REF1_ACT4. Herein, increasing the value of the counting address CNT_ADD by '1' signifies that when a $K^{th}$ word line WLK is selected, the address is changed so that the $(K+1)^{th}$ word line WLK+1 is selected next time. Therefore, with the counting address CNT_ADD, the word lines WL0 to WLN of the plurality of cell arrays 780_1 to 780_4 may be sequentially refreshed.

The address storing unit 770 stores one or more target addresses TAR_ADD1 to TAR_ADD4 that correspond to one or more word lines among the plurality of word lines WL0 to WLN of the plurality of cell arrays 780_1 to 780_4, and when the plurality of second refresh active signals REF2_ACT1 to REF2_ACT4 are activated, the address storing unit 770 outputs the stored target addresses TAR_ADD1 to TAR_ADD4. Herein, when more than two target addresses TAR_ADD1 are stored in the address storing unit 770, the address storing unit 770 may sequentially output the stored target addresses TAR_ADD1 one by one whenever the second refresh active signals REF2_ACT1 are activated. When the second refresh active signals REF2_ACT1 to REF2_ACT4 are sequentially activated, the address storing unit 770 may sequentially output the plurality of target addresses TAR_ADD1 to TAR_ADD4.

The word line selected based on the target addresses TAR_ADD1 to TAR_ADD4 may satisfy one or more conditions described above with reference to FIG. 3.

A word line coupled with a memory cell MC having a shorter data retention time than a reference time may be detected through a test performed in the course of fabricating the memory. Therefore, the target addresses TAR_ADD1 to TAR_ADD4 may be detected through the test performed in the course of fabricating the memory and stored in the address counting unit 760. Herein, the reference time may be decided in the design specification that is adopted as a standard for designing a device. For example, when the reference time is decided to be 64 ms according to the design specification, a word line coupled with a memory cell MC having a shorter data retention time than 64 ms is to be refreshed additionally before the term of 64 ms passes.

To detect the target addresses TAR_ADD1 to TAR_ADD4 of the word line that satisfy the conditions (2) and (3), the memory may include the address detecting unit 610 of FIG. 6 (not shown in FIG. 7).

Figure 8:
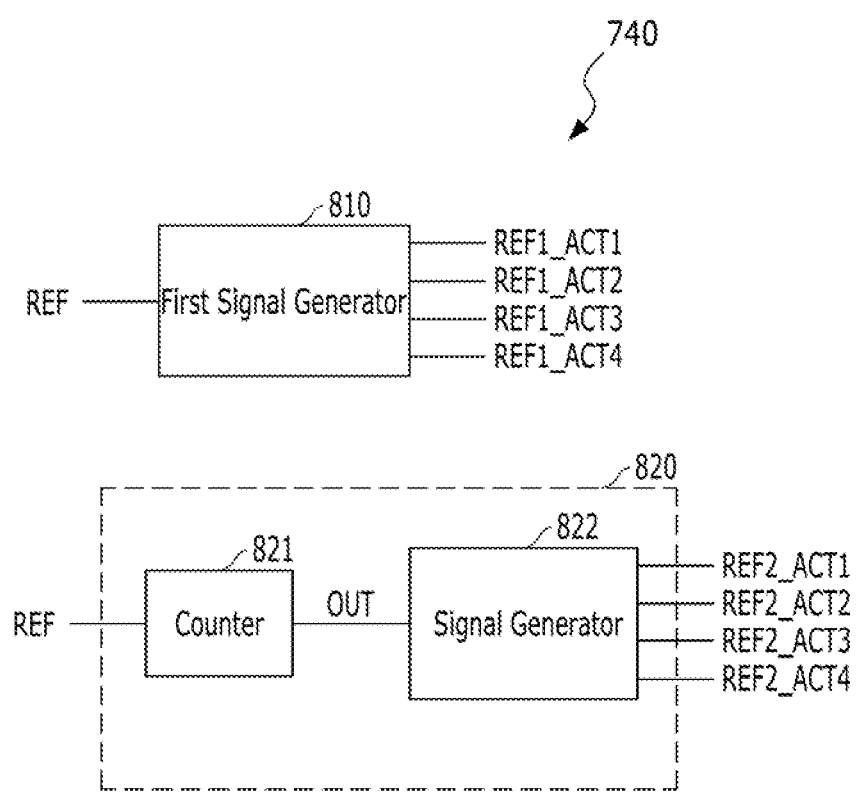
FIG. 8 is a block view illustrating a refresh control unit 740 shown in FIG. 7.

FIG. 8 is a block view illustrating the refresh control unit 740.

Referring to FIG. 8, the refresh control unit 740 includes a first signal generator 810 and a second signal generator 820.

The first signal generator 810 sequentially activates the plurality of first refresh active signals REF1_ACT1 to REF1_ACT4 whenever the refresh command REF is inputted. The second signal generator 820 sequentially activates the plurality of second refresh active signals REF2_ACT1 to REF2_ACT4 whenever the refresh command REF is inputted 8 times.

The second signal generator 820 includes a counter 821 and a signal generator 822. The counter 821 counts the number of times that the refresh command REF is inputted, and when the refresh command REF is counted to be inputted 8 times, the counter 821 activates its own output OUT. When the output OUT of the counter 821 is activated, the signal generator 822 sequentially activates the plurality of second refresh active signals REF2_ACT1 to REF2_ACT4. The counter 821 performs a counting operation again from the initial value after it activates its output OUT.

The counter 821 may be designed to activate its output OUT when the number of times the refresh command REF is inputted is not 8 but other numbers.

Figure 9:
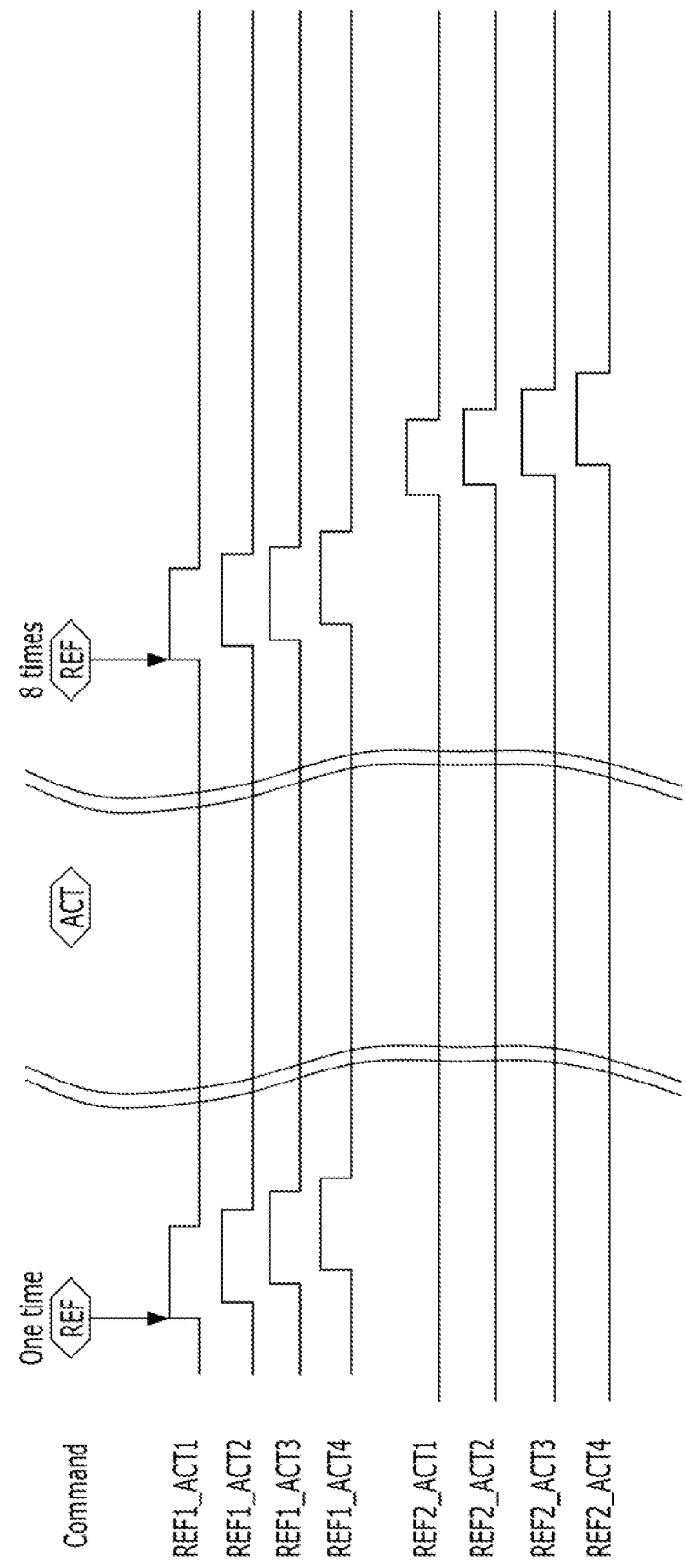
FIG. 9 illustrates an operation of the memory shown in FIG. 7.

FIG. 9 illustrates an operation of the memory shown in FIG. 7.

FIG. 9 shows a case when the refresh command REF is inputted, one word line is refreshed in the cell arrays 780_1 to 780_4, and whenever the refresh command REF is inputted 8 times, two word lines including one word line that is selected based on the target addresses TAR_ADD1 to TAR_ADD4 are refreshed in the cell arrays 780_1 to 780_4. The refresh command REF is inputted at a predetermined interval, and an active command ACT may be inputted between the inputs of the refresh command REF. Hereafter, it is described as an example that the refresh operation begins from the word line WL0 and word lines WLA, WLB, WLC and WLD are selected in each of the cell arrays 780_1 to 780_4 based on the target addresses TAR_ADD1 to TAR_ADD4.

The operation of the memory is described with reference to FIGS. 7 to 9.

When the refresh command REF is inputted for the first time, the first refresh active signals REF1_ACT1 to REF1_ACT4 are sequentially activated, and a word line corresponding to the counting address CNT_ADD is refreshed in the cell arrays 780_1 to 780_4. Herein, the counting address CNT_ADD has a value corresponding to the word line WL0. When the refresh command REF is inputted for the second to seventh times, the word lines WL1 to WL6 corresponding to the counting address CNT_ADD are sequentially refreshed in the cell arrays 780_1 to 780_4, just as the refresh command REF is inputted for the first time.

When the active command ACT is inputted between the inputs of the refresh command REF, a word line corresponding to the input address IN_ADD is activated in the selected cell array.

When the refresh command REF is inputted for the eighth time, the plurality of first refresh active signals REF1_ACT1 to REF1_ACT4 are activated first, then the word line WL7 corresponding to the counting address CNT_ADD in the cell arrays 780_1 to 780_4 is activated. Subsequently, the plurality of second refresh active signals REF2_ACT1 to REF2_ACT4 are sequentially activated, and the word lines WLA, WLB, WLC and WLD that are selected based on the respective target addresses TAR_ADD1 to TAR_ADD4 are refreshed in the cell arrays 780_1 to 780_4.

Subsequently, when the refresh command REF is inputted, the word line corresponding to the counting address CNT_ADD is refreshed in the cell arrays 780_1 to 780_4, just as the case when the refresh command REF is inputted for the first time, and whenever the refresh command REF is inputted for the multiple times of eight, the word lines WLA, WLB, WLC and WLD that are selected based on the target addresses TAR_ADD1 to TAR_ADD4 are additionally refreshed in the plurality of cell arrays 780_1 to 780_4.

The memory in accordance with the embodiment of the present invention sequentially refreshes the plurality of word lines one by one whenever the refresh command REF is inputted, and when the refresh command REF is inputted a predetermined number of times that is equal to or more than twice, the memory additionally refreshes the word line selected based on the target address so that the word line coupled with a memory cell MC having a short data retention time may be used as a normal word line, while reducing the current consumption of the memory by minimizing the number of word lines refreshed for each refresh operation.

Figure 10:
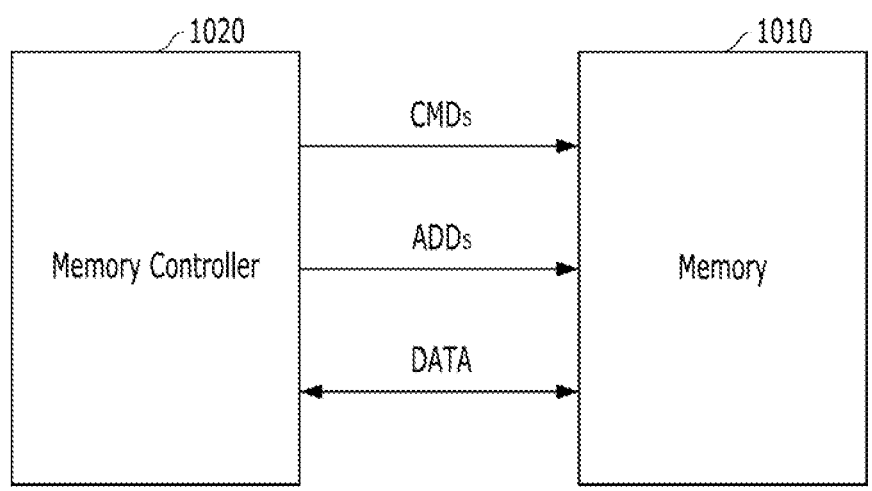
FIG. 10 is a block view illustrating a memory system in accordance with an embodiment of the present invention.

FIG. 10 is a block view illustrating a memory system in accordance with an embodiment of the present invention.

Referring to FIG. 10, the memory system includes a memory 1010 and a memory controller 1020.

The memory controller 1020 controls the operation of the memory 1010 by applying a command $CMD_s$ and an address $ADD_s$ to the memory 1010, and transfers and receives data to and from the memory 1010 during a read operation and a write operation. The memory controller 1020 may input a refresh command REF or an active command ACT into the memory 1010 by transferring the command $CMD_s$. When the active command ACT is inputted, the memory controller 1020 transfers the address $ADD_s$ to the memory 1010 to select a cell array and a word line to be activated. When the refresh command REF is inputted, the memory controller 1020 may not transfer the address $ADD_s$ to the memory 1010 because an address CNT_ADD generated internally within the memory 1010 or an address TAR_ADD stored within the memory 1010 are used.

The memory 1010, which may be one among the memories of FIGS. 3, 6 and 7, receives the command $CMD_s$ and the address $ADD_s$. When the active command ACT is inputted, it performs an active operation. When the refresh command REF is inputted, it performs a refresh operation. Herein, a method of the memory 1010 performing the active operation or the refresh operation is the same as described with reference to FIGS. 3 to 9. Meanwhile, when a read command and a write command are applied from the memory controller 1020, the memory 1010 transfers and receives data to and from the memory controller 1020.

According to an embodiment of the present invention, a memory may operate properly by periodically performing an additional refresh operation on a memory cell having an insufficient data retention time although the memory includes the memory cell having an insufficient data retention time, and a memory system including the memory.

According to another embodiment of the present invention, a memory may operate properly by periodically performing an additional refresh operation on a memory cell whose data has a risk of deterioration due to word line disturbance even when the word line disturbance occurs in the memory, and a memory system including the memory.

While the present invention has been described with respect to the specific embodiments, it will be apparent to those skilled in the art that various changes and modifications may be made without departing from the spirit and scope of the invention as defined in the following claims.

What is claimed is:

1. A memory, comprising:
a plurality of word lines each coupled with at least one memory cell;
an address storing unit suitable for storing at least one target address corresponding to at least one of the word lines; and
a control unit suitable for sequentially activating the plurality of word lines in response to a refresh command that is inputted at a set interval, and activating the word line selected based on the target address whenever the refresh command is inputted a set number of times that is equal to or more than two times.

2. The memory of claim 1, wherein the word line corresponding to the target address includes at least one among
a first word line coupled with a memory cell having a shorter data retention time than a reference time;
a second word line activated in response to an active command more than a reference number of times;
a third word line adjacent to the second word line;
a fourth word line activated in response to the active command in a frequency satisfying a set condition; and
a fifth word line adjacent to the fourth word line.

3. The memory of claim 2, further comprising:
an address detecting unit suitable for detecting the second and fourth word lines, and storing at least one address between an address of the detected word line and an address of a word line disposed adjacent to the detected word line.

4. The memory of claim 1, wherein the control unit is suitable for activating a word line corresponding to an external input address when an active command is inputted, and activating a word line corresponding to a counting address, which is generated by performing a counting operation whenever the refresh command is inputted, when the refresh command is inputted, and activating the word line selected based on the target address whenever the refresh command is inputted in the set number of times.

5. The memory of claim 1, wherein the control unit is suitable for activating at least one word line whenever the refresh command is inputted, and activating at least two word lines which are more than the at least one word line, where the at least two word lines include a word line selected based on the target address, whenever the refresh command is inputted N times, where N is a natural number equal to or greater than 2.

6. The memory of claim 5, wherein the control unit includes:
a refresh control unit suitable for activating a first refresh active signal in response to the refresh command and a second refresh active signal at least once whenever the refresh command is inputted N times; and
a word line control unit suitable for activating the word line corresponding to the external input address when the active command is inputted, the word line corresponding to the counting address when the first refresh active signal is activated, and the word line selected based on the target address when the second refresh active signal is activated.

7. The memory of claim 6, wherein the address storing unit is suitable for outputting the target address when the second refresh active signal is activated.

8. A memory, comprising:
a plurality of word lines each coupled with at least one memory cell;
an address input unit suitable for receiving an external input address;
an address counting unit suitable for performing a counting operation and generating a counting address based on a counting operation result when a refresh command is inputted;
an address storing unit suitable for storing at least one target address corresponding to at least one of the word lines; and
a control unit suitable for activating at least a word line corresponding to the input address inputted to the address input unit when an active command is inputted, activating at least a word line corresponding to the counting address in response to the refresh command, and activating the word line selected based on the target address whenever the refresh command is inputted a set number of times that is equal to or more than two times.

9. The memory of claim 8, wherein the word line selected based on the target address includes at least one among
a first word line coupled with a memory cell having a shorter data retention time than a reference time;
a second word line activated in response to the active command more than a reference number of times;
a third word line adjacent to the second word line;
a fourth word line activated in response to the active command in a frequency satisfying a set condition; and
a fifth word line adjacent to the fourth word line.

10. The memory of claim 8, wherein the control unit is suitable for activating at least one word line whenever the refresh command is inputted, and activating at least two word lines which are more than the at least one word line, where the at least two word lines include a word line selected based on the target address, whenever the refresh command is inputted N times, where N is a natural number equal to or greater than 2.

11. A memory, comprising:
a plurality of cell arrays each of which includes a plurality of word lines each coupled with at least one memory cell;
an address storing unit suitable for storing at least one target address corresponding to at least one of the word lines of the cell arrays; and
a refresh control unit suitable for activating a plurality of first refresh active signals corresponding to the respective cell arrays in response to a refresh command that is inputted at a set interval and activating a plurality of second refresh active signals corresponding to the respective cell arrays whenever the refresh command is inputted a set number of times that is equal to or more than two times; and
a plurality of word line control units suitable for sequentially activating the plurality of word lines of a corresponding cell array in response to a corresponding first refresh active signal among the plurality of first refresh active signals, and activating the word line selected based on the target address of the corresponding cell array in response to a corresponding second refresh active signal among the plurality of second refresh active signals.

12. The memory of claim 11, wherein the word line selected based on the target address includes at least one among
a first word line coupled with a memory cell having a shorter data retention time than a reference time;
a second word line activated in response to an active command more than a reference number of times;
a third word line adjacent to the second word line;
a fourth word line activated in response to the active command in a frequency satisfying a set condition; and
a fifth word line adjacent to the fourth word line.

13. The memory of claim 11, further comprising:
an address input unit suitable for receiving an external input address; and
an address counting unit suitable for performing a counting operation and generating a counting address based on a counting operation result when the refresh command is inputted.

14. The memory of claim 13, wherein the multiple word line control units are suitable for activating a word line corresponding to the input address inputted to the address input unit when the active command is inputted and a corresponding cell array is selected, activating the word line corresponding to the counting address when the corresponding first refresh active signal is activated, and activating the word line selected based on the target address when the corresponding second refresh active signal is activated.

15. The memory of claim 11, wherein the refresh control unit sequentially activates the first refresh active signals whenever the refresh command is inputted, and sequentially activates the second refresh active signals whenever the refresh command is inputted the set number of times.

\* \* \* \* \*